United States Patent
Dean et al.

(10) Patent No.: US 7,515,437 B2
(45) Date of Patent: Apr. 7, 2009

(54) BI-POSITIONAL EXPANSION CARD RETAINER

(75) Inventors: Ronald Paul Dean, Fort Collins, CO (US); Jonathan D Bassett, Fort Collins, CO (US); James Bullington, Athens, AL (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 745 days.

(21) Appl. No.: 11/019,697

(22) Filed: Dec. 21, 2004

(65) Prior Publication Data

US 2006/0133059 A1   Jun. 22, 2006

(51) Int. Cl.
*H05K 1/11* (2006.01)

(52) U.S. Cl. .................. 361/801; 361/759; 361/802

(58) Field of Classification Search ................ 361/740, 361/747, 756, 798, 807, 759, 801, 802
See application file for complete search history.

(56) References Cited

U.S. PATENT DOCUMENTS 4,872,853 A * 10/1989 Webster ...................... 439/327
5,781,417 A * 7/1998 Albani et al. ................ 361/801
6,017,004 A * 1/2000 Grantham ................... 248/27.3
6,442,037 B1 * 8/2002 Boe ............................ 361/759

OTHER PUBLICATIONS

Jonathan D. Bassett, "Expansion Card Support Mechanism" US pending Patent Appl. 200308697-1, U.S. Appl. No. 10/723,024, filed Nov. 26, 2003, pp. 29.
Jonathan D. Bassett, factual Declaration for US Pending Patent Appl. 00405284-1,"Bi-Positional Expansion Card Retainer", U.S. Appl. No. 11/019,697, filed Dec. 21, 2004, pp. 4.

* cited by examiner

*Primary Examiner*—Randy W. Gibson
*Assistant Examiner*—Abiy Getachew

(57) ABSTRACT

A one-piece expansion card retainer may be installed in either of two positions to accommodate both full-height and low-profile expansion cards. The bi-positional expansion card retainer exerts flexional force on an expansion card to help maintain the expansion card in its proper position during shipment of an electronic device.

29 Claims, 5 Drawing Sheets

BI-POSITIONAL EXPANSION CARD RETAINER

FIELD OF THE INVENTION

The present invention relates generally to electronic devices and more specifically to apparatuses for holding the expansion cards of such devices in place during shipment.

BACKGROUND OF THE INVENTION

Electronic devices such as computers typically have graphics cards, input/output (I/O) cards, or other expansion cards that are large and heavy. During shipment, an electronic device may be subjected to shock and vibration that exceeds the holding capacity of traditional rear mounting screws and board connectors. Consequently, expansion cards and the surrounding electronics may be damaged during shipment, rendering the electronic device non-functional.

A variety of techniques may be used to secure expansion cards during shipment. For example, a full-length Accelerated Graphics Port (AGP) expansion card may include an end retainer that can be secured to the chassis of the electronic device using a front attachment screw. However, the end retainer does not provide intermediate support for the expansion card, which leaves the expansion card vulnerable to vibrations and movement. Another example is a retaining apparatus mounted to a bar that spans the chassis over the expansion card. Unfortunately, the bar renders the expansion card inaccessible unless the bar is first removed.

Some retention apparatuses are made from multiple parts and are designed to accommodate expansion cards of a wide variety of sizes. Although such retention apparatuses are effective, they are also relatively complex and expensive. One example of such a retention apparatus is described in U.S. patent application Ser. No. 10/723,024, "Expansion Card Support Mechanism," to Hewlett-Packard Development Company, L.P., which was filed on Nov. 26, 2003. With the advent of the recent Peripheral Component Interconnect (PCI) bus standard called "PCI-Express," expansion card manufacturers are now strongly encouraged to build expansion cards in one of two sizes: (1) full-height and (2) low-profile. A multi-piece retention apparatus designed to accommodate expansion cards of a wide variety of sizes is unnecessarily elaborate and expensive in the context of PCI-Express cards.

It is thus apparent that there is a need in the art for an improved expansion card retainer.

SUMMARY OF THE INVENTION

A one-piece, bi-positional expansion card retainer is provided. The expansion card retainer can accommodate both full-height and low-profile expansion cards. An electronic device incorporating the expansion card retainer is also provided.

Other aspects and advantages of the present invention will become apparent from the following detailed description, taken in conjunction with the accompanying drawings, illustrating by way of example the principles of the invention.

DETAILED DESCRIPTION OF THE INVENTION

An improved expansion card retainer may include an attachment end that can be attached to a chassis in either of two positions to accommodate both full-height and low-profile expansion cards (e.g., either type of PCI-Express card). A distal end opposite the attachment end may apply flexional force on a peripheral edge of the expansion card to help keep the expansion card in its expansion slot during shipment. The simplicity of such a design allows the expansion card retainer to be a single piece without moving parts. For example, the expansion card retainer may be a single piece of molded plastic. The cost of such an expansion card retainer can be significantly less than a more complex multi-piece retainer. Furthermore, such an improved expansion card retainer may be adapted to be installed and removed without tools or fasteners. Also, the expansion card retainer may bear indicia indicating how to attach the expansion card retainer to the chassis for full-height and low-profile expansion cards, respectively.

Figure 1:
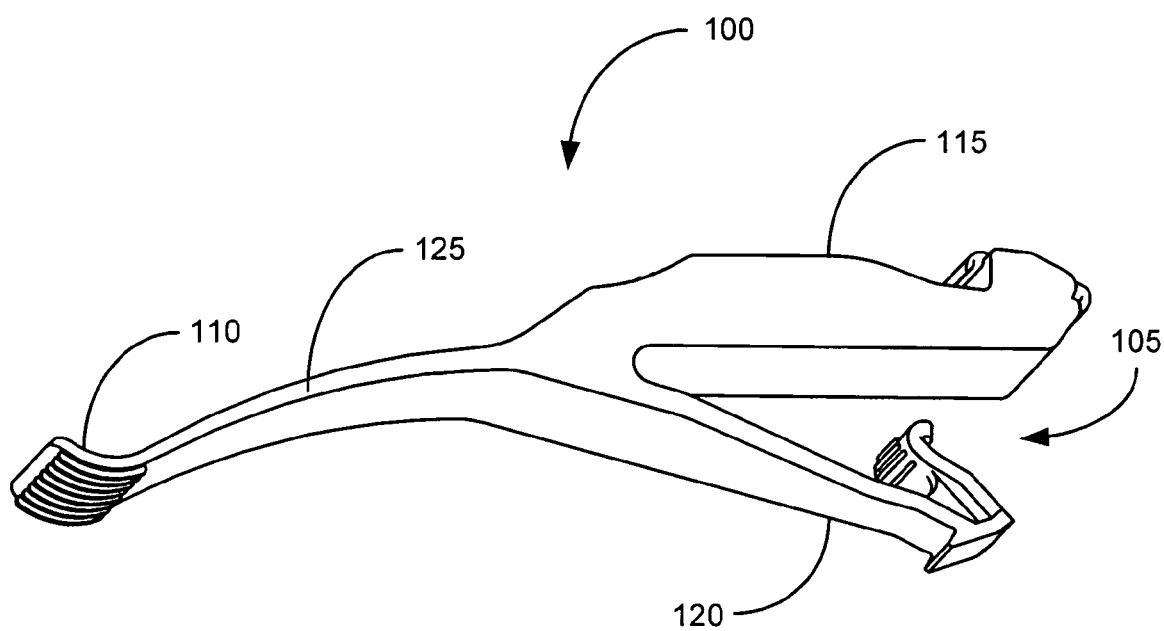
FIG. 1 is a perspective drawing of an expansion card retainer in accordance with an illustrative embodiment of the invention.

FIG. 1 is a perspective drawing of an expansion card retainer 100 in accordance with an illustrative embodiment of the invention. Expansion card retainer 100 may comprise a chassis-mountable arm comprising attachment end 105 and distal end 110. Attachment end 105 may further comprise rigid portion 115 and flexible spring portion 120. Flexing portion 125 between attachment end 105 and distal end 110 allows distal end 110 to exert flexional force on an edge of an expansion card with which distal end 110 is in contact, when attachment end 105 is attached, under spring tension, to the chassis of an electronic device. This flexional force helps keep the expansion card in its proper position (i.e., in its associated expansion slot) during shipment.

Figure 2A:
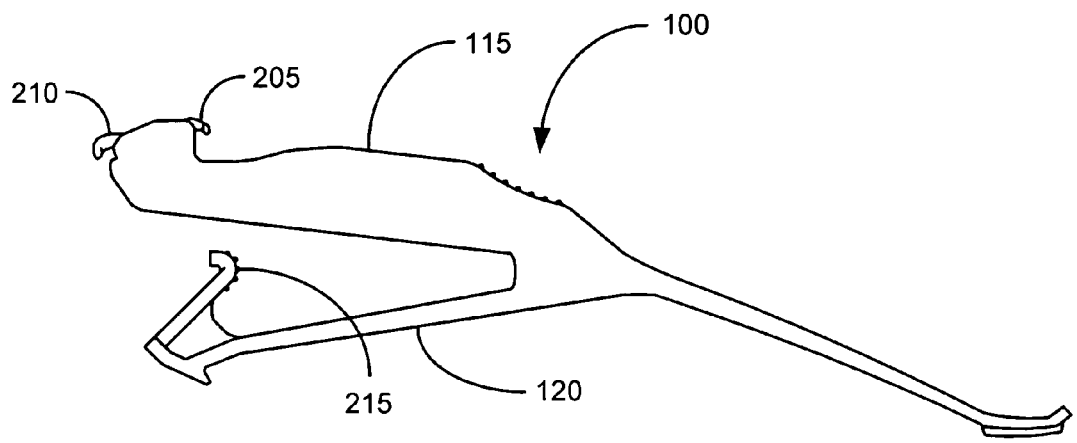
FIGS. 2A-2C are side, top, and bottom views, respectively, of the expansion card retainer shown in FIG. 1.
Figure 2B:
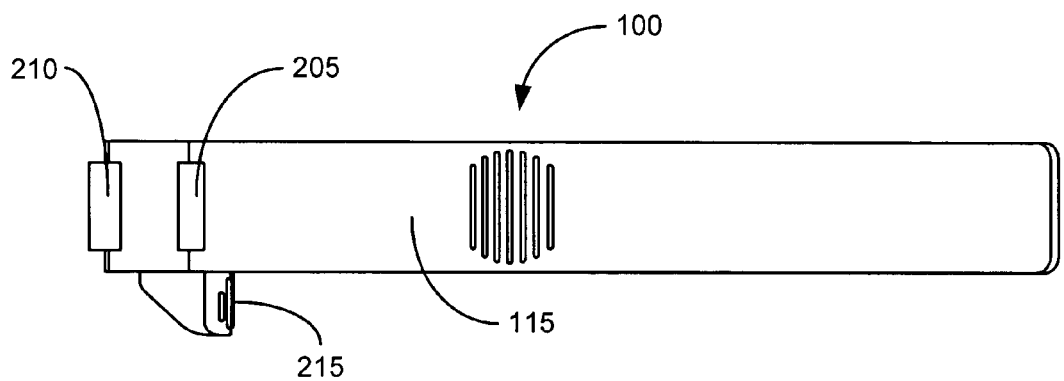
Figure 2C:
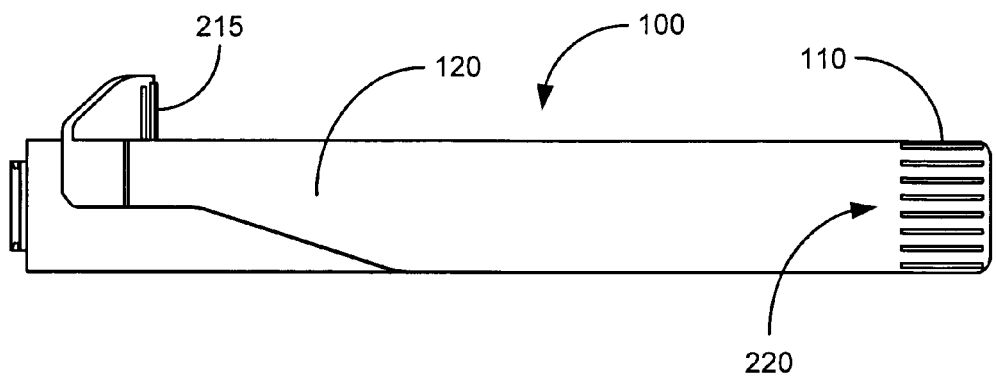

FIGS. 2A-2C are side, top, and bottom views, respectively, of the expansion card retainer shown in FIG. 1, in accordance with an illustrative embodiment of the invention. As shown in FIG. 2A, rigid portion 115 may include two opposing hooks, inside hook 205 and outside hook 210. Either one of inside hook 205 and outside hook 210 may engage with a cutout in a chassis to, in part, attach expansion card retainer 100 to the chassis. The choice of inside hook 205 or outside hook 210 determines in which of two positions the expansion card retainer is attached to the chassis. One position (inside hook 205) accommodates full-height expansion cards; the other (outside hook 210), low-profile expansion cards. Attachment of expansion card retainer 100 to a chassis may be completed by flexing flexible spring portion 120 toward rigid portion 115 to allow flexible spring portion 120 to hook a lip in the chassis. To aid the flexing of flexible spring portion 120, a finger tab 215 may be provided on flexible spring portion 120. As shown in FIG. 2B, finger tab 215 may be laterally offset from rigid portion 115 for convenience. FIG. 2C shows substantially parallel ridges 220 that may be included on the underside of distal end 110. When distal end 110 contacts the edge of an expansion card, the edge of the expansion card may contact distal end 110 within one of the substantially parallel slots defined by substantially parallel ridges 220. Contacting the expansion card within such a slot helps reduce side-to-side motion of the expansion card during shipment. The design of flexible spring portion 120 and laterally offset finger tab 215 shown in FIG. 2C has the advantage that expansion card retainer 100 may be "nested" with like expansion card retainers 100 so that expansion card retainer 100 may be attached to the chassis of an electronic device adjacent to like expansion card retainers 100. That is, expansion card retainer 100 may be deployed for adjacent expansion slots of an electronic device.

Figure 3A:
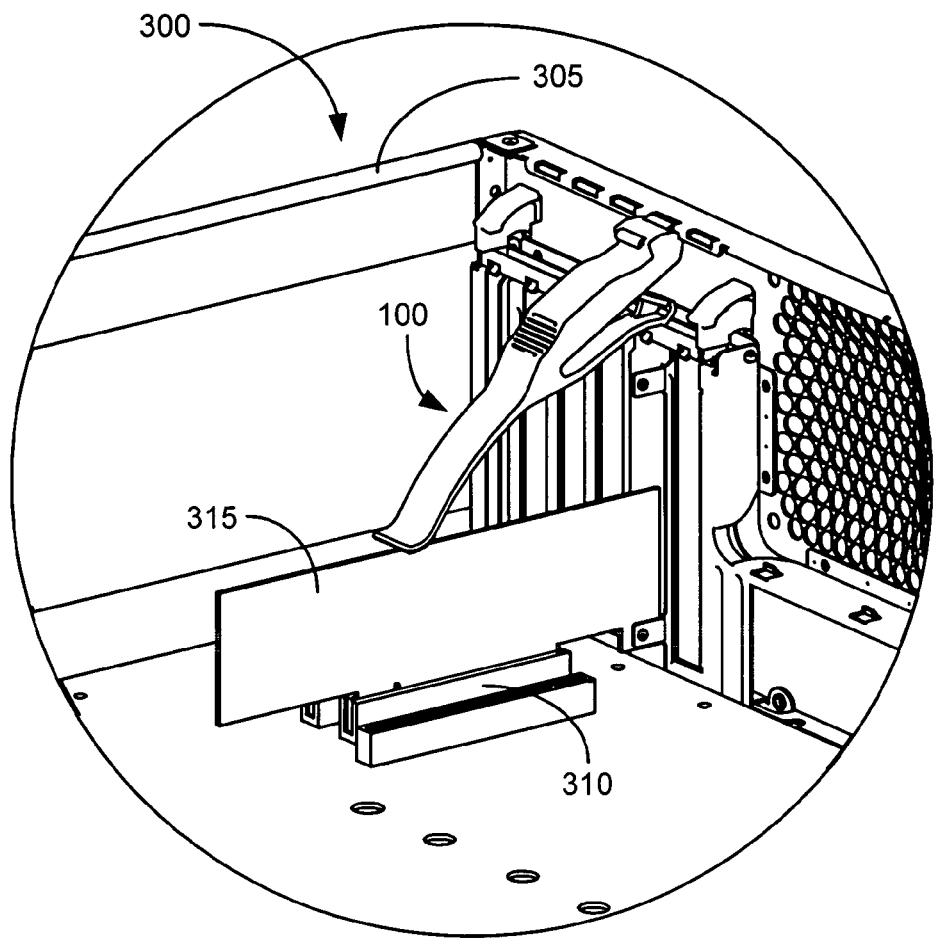
FIG. 3A is an illustration of an electronic device in which an expansion card retainer has been deployed to secure a low-profile expansion card, in accordance with an illustrative embodiment of the invention.

FIG. 3A is an illustration of an electronic device 300 in which expansion card retainer 100 has been deployed to secure a low-profile expansion card, in accordance with an illustrative embodiment of the invention. Electronic device 300 may be any electronic device that includes expansion slots for graphics cards or other expansion cards. For example, electronic device 300 may be a desktop computer or a workstation. In the example of FIG. 3A, electronic device 300 is a computer that has a chassis 305 defining a hollow interior in which one or more expansion slots 310 have been mounted. Low-profile expansion card 315 (e.g., a PCI-Express card) may be inserted into an expansion slot 310 (i.e., electrically connected with a bus of electronic device 300 via expansion slot 310). Low-profile expansion card 315 may be biased toward its proper position in expansion slot 310 during shipment by installing expansion card retainer 100 as illustrated.

Figure 3B:
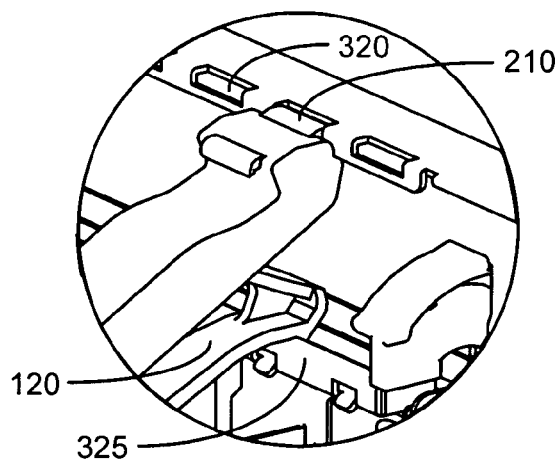
FIG. 3B is a close-up view showing one position in which an expansion card retainer may attach to the chassis of an electronic device in accordance with an illustrative embodiment of the invention.

FIG. 3B is a close-up view showing how expansion card retainer 100 attaches to chassis 305 in FIG. 3A, in accordance with an illustrative embodiment of the invention. To secure an expansion card such as low-profile expansion card 315, outside hook 210 may be hooked over the top of a cutout 320 in chassis 305, and flexible spring portion 120 may be flexed temporarily using finger tab 215 to allow flexible spring portion 120 to hook behind lip 325 in chassis 305. Since flexible spring portion 120 is hooked behind lip 325 under spring tension along flexing portion 125, distal end 110 exerts flexional force upon the top edge of low-profile expansion card 315.

Figure 4A:
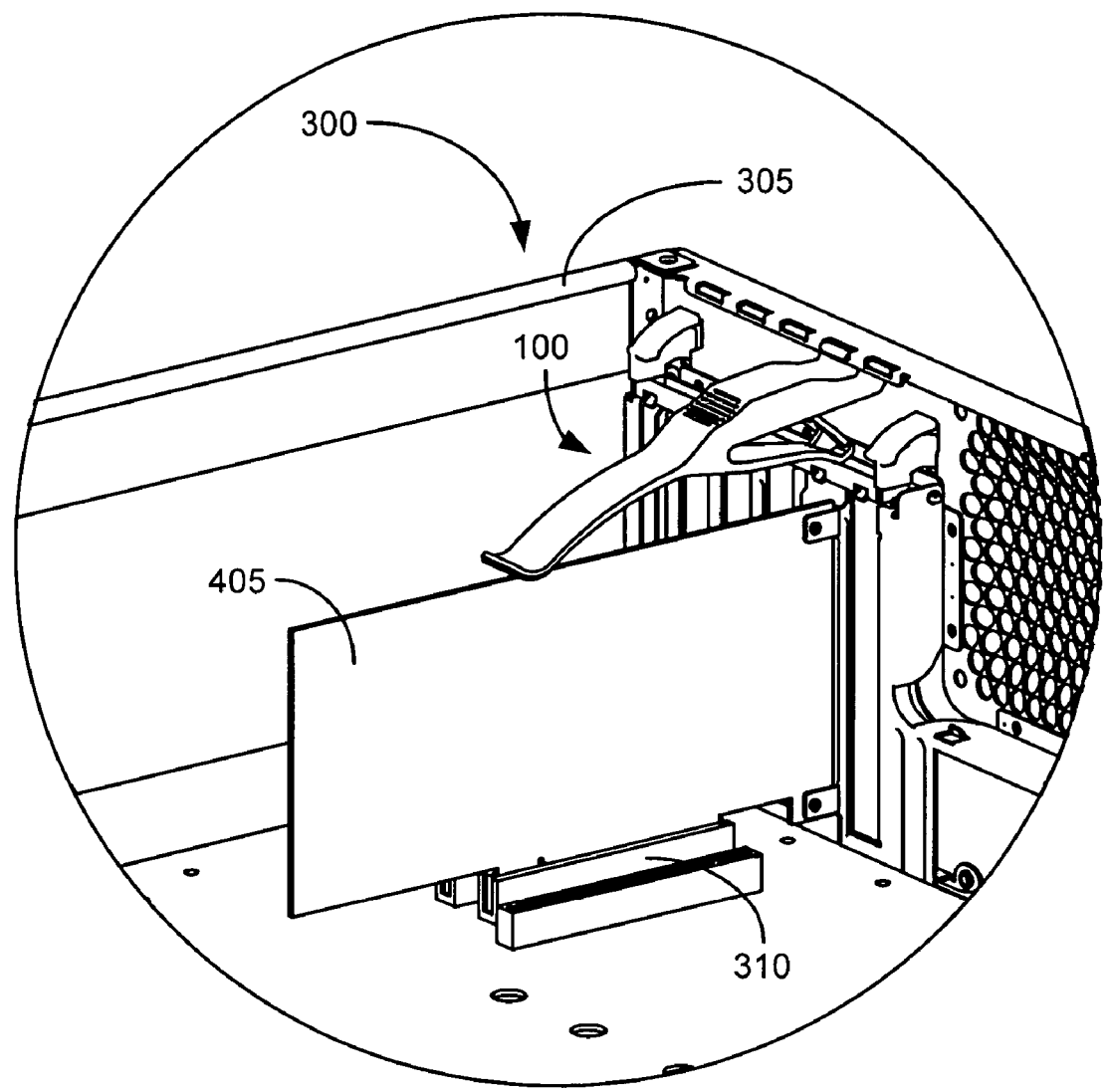
FIG. 4A is an illustration of an electronic device in which an expansion card retainer has been deployed to secure a full-height expansion card, in accordance with an illustrative embodiment of the invention.

FIG. 4A is an illustration of electronic device 300 in which expansion card retainer 100 has been deployed to secure a full-height expansion card, in accordance with an illustrative embodiment of the invention. In FIG. 4A, to accommodate full-height expansion card 405 (e.g., a PCI-Express card), expansion card retainer 100 is attached to chassis 305 in a different position than that shown in FIGS. 3A and 3B. In this different position, expansion card retainer 100 is angled more horizontally than for low-profile expansion card 315 but still exerts flexional force on the top edge of full-height expansion card 405 in a similar fashion.

Figure 4B:
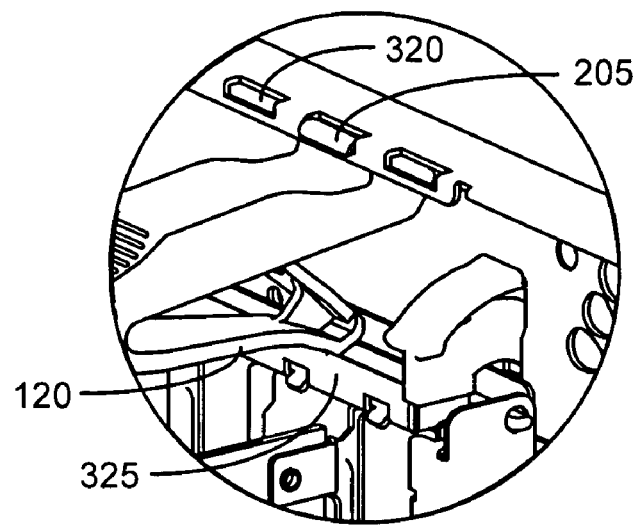
FIG. 4B is a close-up view showing another position in which an expansion card retainer may attach to the chassis of an electronic device in accordance with an illustrative embodiment of the invention.

FIG. 4B is a close-up view showing how expansion card retainer 100 attaches to chassis 305 in FIG. 4A, in accordance with an illustrative embodiment of the invention. To secure an expansion card such as full-height expansion card 405, inside hook 205 is hooked underneath cutout 320, and flexible spring portion 120 is used in the same way as described in connection with FIG. 3B to complete the attachment, under spring tension, of expansion card retainer 100 to chassis 305. Even if no expansion card 315 or 405 is present in a particular expansion slot 310, the design of attachment end 105 of expansion card retainer 100 allows expansion card retainer 100 to remain securely attached to chassis 305. This allows expansion card retainer 100 to be secured in its place for shipment of electronic device 300 without an expansion card 315 or 405 being installed in the applicable expansion slot 310.

Figure 5:
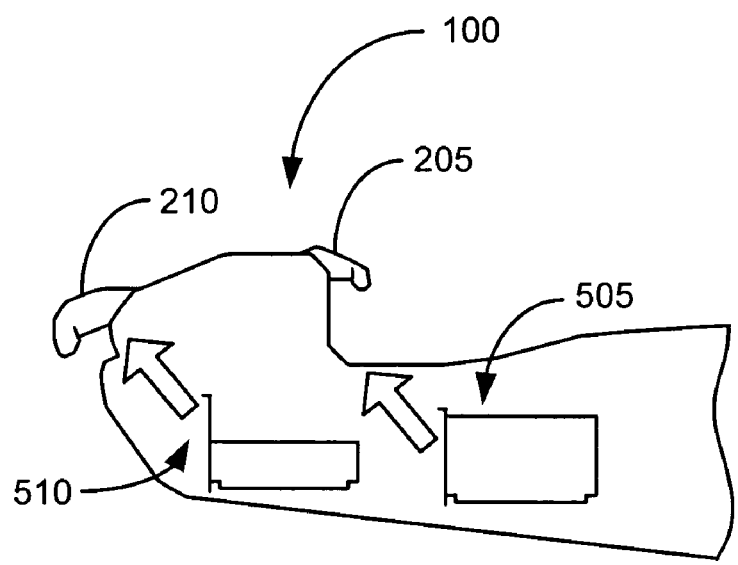
FIG. 5 is a close-up view of an expansion card retainer bearing indicia indicating which of two hooks corresponds to full-height and low-profile expansion cards, respectively, in accordance with an illustrative embodiment of the invention.

FIG. 5 is a close-up view of a portion of expansion card retainer 100 bearing optional indicia indicating that inside hook 205 and outside hook 210 correspond, respectively, to full-height and low-profile expansion cards, in accordance with an illustrative embodiment of the invention. Indicium 505 indicates a full-height expansion card 405 and may include an arrow pointing toward inside hook 205, which corresponds to that position. Indicium 510 indicates a low-profile expansion card 315 and may include an arrow pointing toward outside hook 210, which corresponds to that position. Such indicia may be included on expansion card retainer 100 in a variety of ways. For example, a decal bearing the indicia may be applied to expansion card retainer 100, or the indicia may be stamped into the molded plastic of which expansion card retainer 100 is made.

The foregoing illustrations show only one of a variety of ways of implementing expansion card retainer 100. Many other variations are possible. For example, different cutouts 320 in chassis 305 may facilitate different approaches to bi-positional attachment of expansion card retainer 100 to chassis 305. Likewise, different numbers and arrangements of hooks may be provided on attachment end 105. Specifically, one hook instead of two may be used on attachment end 105, and two cutouts may be provided in chassis 305 to provide for two different positions. In another embodiment, two hooks may be used on attachment end 105, but the two hooks may point the same direction instead of facing opposite directions as discussed above. Also, flexible spring portion 120 may be implemented differently than shown above to accommodate a particular chassis design. All of these variations are considered to be within the scope of the invention as claimed.

The foregoing description of the present invention has been presented for the purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An expansion card retainer, comprising:
   a one-piece, chassis-mountable arm comprising an attachment end, a distal end, and a flexing portion between the attachment end and the distal end;
   wherein the attachment end is adapted to attach to a chassis in one of a first position and a second position to accommodate full-height and low-profile expansion cards, respectively, and the distal end exerts flexional force produced by the flexing portion on an edge of an expansion card with which the distal end is in contact, when the attachment end is attached to the chassis; and wherein the attachment end comprises a rigid portion and a flexible spring portion that can be flexed toward the rigid portion, the rigid portion having opposing first and second hooks.

2. The expansion card retainer of claim 1, wherein the first hook engages with a cutout in the chassis when the attachment end is attached to the chassis in the first position, and the second hook engages with the cutout when the attachment end is attached to the chassis in the second position, and the flexible spring portion being adapted to hook a lip in the chassis to secure the attachment end to the chassis.

3. The expansion card retainer of claim 2, wherein the expansion card retainer bears indicia indicating that the first hook is associated with full-height expansion cards and that the second hook is associated with low-profile expansion cards.

4. The expansion card retainer of claim 2, wherein the flexible spring portion has a finger tab that is laterally offset with respect to the rigid portion.

5. The expansion card retainer of claim 4, wherein the flexible spring portion and the finger tab are configured such that the expansion card retainer may be attached to the chassis adjacent to like expansion card retainers.

6. The expansion card retainer of claim 1, wherein the distal end has a set of substantially parallel ridges that define a set of substantially parallel slots and the edge of the expansion card contacts the distal end within one of the substantially parallel slots.

7. The expansion card retainer of claim 1, wherein the expansion card retainer can be attached to the chassis and detached from the chassis without tools.

8. The expansion card retainer of claim 1, wherein the one-piece, chassis-mountable arm comprises molded plastic.

9. An electronic device, comprising:
a chassis defining an interior of the electronic device;
an expansion slot mounted within the interior;
an expansion card electrically connected with the expansion slot, the expansion card being one of a full-height and a low-profile expansion card; and
an expansion card retainer, comprising:
a one-piece, chassis-mountable arm comprising an attachment end, a distal end, and a flexing portion between the attachment end and the distal end; and
wherein the attachment end is attached to the chassis in one of a first position and a second position to accommodate the height of the expansion card and the distal end exerts flexional force produced by the flexing portion on an edge of the expansion card with which the distal end is in contact to bias the expansion card in its position in which it is electrically connected with the expansion slot; and
wherein the attachment end comprises a rigid portion and a flexible spring portion that can be flexed toward the rigid portion, the rigid portion having opposing first and second hooks.

10. The electronic device of claim 9, wherein the first hook engages with a cutout in the chassis when the attachment end is attached to the chassis in the first position, and the second hook engages with the cutout when the attachment end is attached to the chassis in the second position, and the flexible spring portion being adapted to hook a lip in the chassis to secure the attachment end to the chassis.

11. The electronic device of claim 10, wherein the expansion card retainer bears indicia indicating that the first hook is associated with full-height expansion cards and that the second hook is associated with low-profile expansion cards.

12. The electronic device of claim 10, wherein the flexible spring portion has a finger tab that is laterally offset with respect to the rigid portion.

13. The electronic device of claim 9, wherein the distal end has a set of substantially parallel ridges that define a set of substantially parallel slots and the edge of the expansion card contacts the distal end within one of the substantially parallel slots.

14. The electronic device of claim 9, wherein the one-piece, chassis-mountable arm comprises molded plastic.

15. The electronic device of claim 9, wherein the electronic device comprises a computer.

16. The electronic device of claim 9, wherein the expansion card retainer is configured to remain securely attached to the chassis when the expansion card is absent from the expansion slot.

17. An expansion card retainer, comprising:
means for attachment to a chassis, the means for attachment to a chassis being adapted to attach to the chassis in one of a first position and a second position to accommodate full-height and low-profile expansion cards, respectively; and
means for contacting an edge of an expansion card, the means for contacting an edge of an expansion card being adapted to exert flexional force on the expansion card, when the means for attachment to a chassis is attached to the chassis; and
wherein the means for attachment to a chassis comprises a rigid portion and a flexible spring portion that can be flexed toward the rigid portion, the rigid portion having opposing first and second hooks.

18. The expansion card retainer of claim 17, wherein the first hook engages with a cutout in the chassis when the means for attachment to a chassis is attached to the chassis in the first position, and the second hook engages with the cutout when the means for attachment to a chassis is attached to the chassis in the second position, and the flexible spring portion being adapted to hook a lip in the chassis to secure to the chassis the means for attachment to a chassis.

19. The expansion card retainer of claim 18, wherein the expansion card retainer bears indicia indicating that the first hook is associated with full-height expansion cards and that the second hook is associated with low-profile expansion cards.

20. The expansion card retainer of claim 18, wherein the flexible spring portion has a finger tab that is laterally offset with respect to the rigid portion.

21. The expansion card retainer of claim 20, wherein the flexible spring portion and the finger tab are configured such that the expansion card retainer may be attached to the chassis adjacent to like expansion card retainers.

22. The expansion card retainer of claim 17, wherein the means for contacting an edge of an expansion card has a set of substantially parallel ridges that define a set of substantially parallel slots and the edge of the expansion card contacts the means for contacting an edge of an expansion card within one of the substantially parallel slots.

23. An electronic device, comprising:
a chassis defining an interior of the electronic device;
an expansion slot mounted within the interior;
an expansion card electrically connected with the expansion slot, the expansion card being one of a full-height and a low-profile expansion card; and an expansion card retainer, comprising:

means for attachment to the chassis, the means for attachment to the chassis being adapted to attach to the chassis in one of a first position and a second position to accommodate the height of the expansion card; and means for contacting an edge of the expansion card, the means for contacting an edge of the expansion card being adapted to exert flexional force on the expansion card to bias the expansion card in its position in which it is electrically connected with the expansion slot;

wherein the means for attachment to the chassis comprises a rigid portion and a flexible spring portion that can be flexed toward the rigid portion, the rigid portion having opposing first and second hooks.

24. The electronic device of claim 23, wherein the first hook engages with a cutout in the chassis when the means for attachment to the chassis is attached to the chassis in the first position, and the second hook engages with the cutout when the means for attachment to the chassis is attached to the chassis in the second position, and the flexible spring portion being adapted to hook a lip in the chassis to secure to the chassis the means for attachment to the chassis.

25. The electronic device of claim 24, wherein the expansion card retainer bears indicia indicating that the first hook is associated with full-height expansion cards and that the second hook is associated with low-profile expansion cards.

26. The electronic device of claim 24, wherein the flexible spring portion has a finger tab that is laterally offset with respect to the rigid portion.

27. The electronic device of claim 23, wherein the means for contacting an edge of the expansion card has a set of substantially parallel ridges that define a set of substantially parallel slots and the edge of the expansion card contacts the means for contacting an edge of the expansion card within one of the substantially parallel slots.

28. The electronic device of claim 23, wherein the electronic device comprises a computer.

29. The electronic device of claim 23, wherein the expansion card retainer is configured to remain securely attached to the chassis when the expansion card is absent from the expansion slot.

* * * * *